(12) United States Patent
Ozgun et al.

(10) Patent No.: US 8,467,749 B2
(45) Date of Patent: Jun. 18, 2013

(54) MONOLITHIC FM-BAND TRANSMIT POWER AMPLIFIER FOR MOBILE CELLULAR DEVICES AND METHOD OF OPERATION THEREOF

(75) Inventors: Mehmet T. Ozgun, Plano, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 823 days.

(21) Appl. No.: 12/253,205

(22) Filed: Oct. 16, 2008

(65) Prior Publication Data

US 2010/0099368 A1    Apr. 22, 2010

(51) Int. Cl.
*H04B 1/04* (2006.01)

(52) U.S. Cl.
USPC ..................................... 455/127.2

(58) Field of Classification Search
None
See application file for complete search history.

(56) References Cited

U.S. PATENT DOCUMENTS

| | | | |
|---|---|---|---|
| 5,737,035 A * | 4/1998 | Rotzoll | 348/725 |
| 7,616,068 B2 * | 11/2009 | Anand | 331/17 |
| 2004/0085144 A1 * | 5/2004 | Wu et al. | 331/117 R |
| 2006/0246842 A1 * | 11/2006 | Mohindra | 455/63.1 |
| 2008/0101525 A1 * | 5/2008 | Wu | 375/376 |
| 2008/0136468 A1 * | 6/2008 | Li et al. | 327/122 |
| 2010/0172435 A1 * | 7/2010 | Ozgun et al. | 375/295 |

* cited by examiner

*Primary Examiner* — Lincoln Donovan
*Assistant Examiner* — Khareem E Almo
(74) *Attorney, Agent, or Firm* — Wade J. Brady, III; Frederick J. Telecky, Jr.

(57) ABSTRACT

An FM-band transmit power amplifier and a method of transmitting in multiple bands. In one embodiment, the FM-band transmit power amplifier has an input and an output and includes: (1) a pre-filter including a charge-pump based integrator coupled to the input and a passive notch filter having a notch frequency in a band other than an FM band and (2) an output driver coupled between the passive pre-filter and the output and having PMOS and NMOS transconductors configured to receive an output from the passive filter.

6 Claims, 5 Drawing Sheets

US 8,467,749 B2

MONOLITHIC FM-BAND TRANSMIT POWER AMPLIFIER FOR MOBILE CELLULAR DEVICES AND METHOD OF OPERATION THEREOF

TECHNICAL FIELD OF THE INVENTION

The invention is directed, in general, to radio frequency (RF) transmitters and, more specifically, to a monolithic FM-band transmit power amplifier for mobile cellular devices and a method of operating the same to transmit in multiple bands.

BACKGROUND OF THE INVENTION

FM-band transmitters find broad application in many types of wireless devices. Monolithic FM-band transmitters are particularly desired for mobile cellular devices given their compactness, reliability and low power consumption.

Designing the transmit power amplifier of an FM-band transmitter does not present a challenge for most applications. A power-efficient, nonlinear, switching power amplifier can be designed for the type of modulation the transmitter uses. However, a nonlinear power amplifier cannot be used in a mobile cellular device that is capable of communicating using FM and one or more other bands, e.g., Global System for Mobile Communications (GSM). Optimizing the efficiency of the nonlinear power amplifier for the FM band (i.e., about 76-108 MHz) degrades its performance in the other bands.

SUMMARY OF THE INVENTION

To address the above-discussed deficiencies of the prior art, one aspect of the invention provides an FM-band transmit power amplifier and a method of transmitting in multiple bands. In one embodiment, the FM-band transmit power amplifier has an input and an output and includes: (1) a pre-filter including a charge-pump based integrator coupled to the input and a passive notch filter having a notch frequency in a band other than an FM band and (2) an output driver coupled between the passive pre-filter and the output and having PMOS and NMOS transconductors configured to receive an output from the passive filter.

In another embodiment, the FM-band transmit power amplifier includes: (1) a pre-filter including a charge-pump based integrator coupled to the input and first and second passive RC notch filters having a notch frequency in a band other than an FM band, the first and second passive RC notch filters having tunable capacitors such that the notch frequency is tunable, the band other than the FM band being selectable and (2) an output driver coupled between the passive pre-filter and the output and having separately biased PMOS and NMOS transconductors configured to receive an output from the passive filter.

BRIEF DESCRIPTION OF THE DRAWINGS

For a more complete understanding of the invention, reference is now made to the following descriptions taken in conjunction with the accompanying drawings, in which.

DETAILED DESCRIPTION

Figure 1:
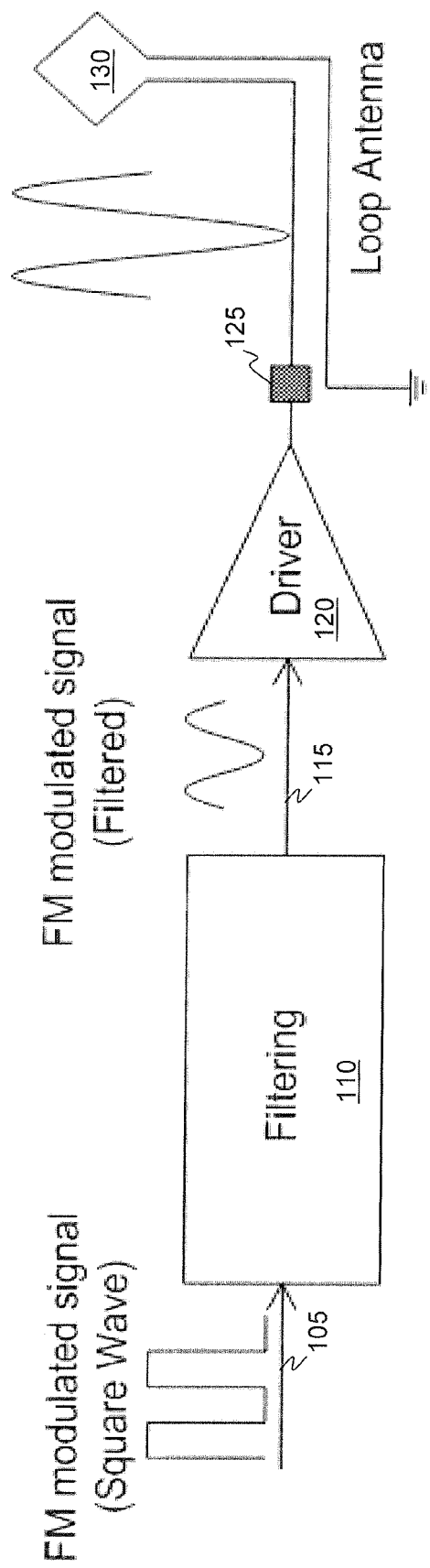
FIG. 1 is a simplified block diagram of an FM power amplifier containing a pre-filter and an output driver.

In the following discussion, "on-chip" denotes components that share the same substrate with the majority of the transmit power amplifier, and "off-chip" denotes components that do not share the same substrate with the majority of the transmit power amplifier and therefore are merely electrically coupled to the remainder of the transmit power amplifier. Internal circuits use on-chip components.

As stated above, optimizing the nonlinearity of the power amplifier for FM degrades its performance under other bands. Hence, a highly linear, but still power-efficient, transmit power amplifier has to be used. However, it is difficult to design a monolithic transmit power amplifier that meets today's requirements for a mobile cellular device. Following are some typical requirements that may be encountered in designing a transmit power amplifier for a mobile cellular device. They serve as examples only.

1. A required output voltage of more than 2V peak-to-peak in a 65 nm pure Complementary Metal-Oxide Semiconductor (CMOS) monolithic integrated circuit (IC) with a 1.4V power supply. Off-chip RF inductors and impedance-matching devices should generally be avoided, since they require the use of special electrostatic discharge (ESD) devices, tend to incur reliability problems and require a special linear output stage.

2. The out-of-band emission should be lower than −110 dBm starting at 750 MHz.

3. Since a resonated loop antenna has a high quality, or Q, factor, the impedance of the antenna should be tunable for each transmit frequency, using an internal tuning circuit in one embodiment. If employed, the tuning circuit should also be high-Q so as not to degrade overall performance. Furthermore, the tuning circuit should be wide band tuning, e.g., from 76 MHz to 108 MHz.

An FM signal can be produced by modulating the frequency of an oscillator. With today's technology, on-chip inductors are low-Q, making it almost impossible to design an oscillator to oscillate in the FM band with on-chip inductors. Instead, the off-chip inductors are used, or the oscillator is designed such that it resonates at a higher frequency which is then divided down to yield a carrier suitable for FM-band transmission. In the latter case, the frequency modulated carrier, called the transmitter signal, is a square wave that contains substantial information in its harmonics. If this square wave is transmitted directly without any filtering, the harmonics will degrade the performance of the other wireless applications inside the mobile cellular device.

If the transmitter signal is a square wave, the Fourier series coefficients of the transmitted signal are as follows:

$$a_k = \frac{\sin(k\pi)}{k\pi},$$

where k is the number of the harmonic of the signal. Thus, the power of the $7^{th}$ harmonic is seven times (17 dB) lower than the fundamental frequency, whereas the power of the $9^{th}$ harmonic is nine times (19 dB) lower than the fundamental frequency. These are only two of many harmonics may fall into the band of other cellular applications. If the sensitivity of a GSM cellular receiver is assumed to be −110 dBm and the required output power of the FM-band transmitter power amplifier to be 0 dBm, the required attenuation on the $9^{th}$ harmonic of a square wave should be close to 90 dB to prevent any degradation in GSM activity. As a reminder, depending on the frequency of the FM radio, the number of the harmonics that violate the GSM band may change. In addition, a given mobile cellular device may have more than one cellular radio and often operates in more than one GSM band.

Another challenge comes if the mobile cellular device uses a loop antenna. A loop antenna, either a coil antenna or a loop of wire on a printed circuit board, is a high Q antenna with high impedance. However, the efficiency of the antenna, i.e., the gain of the antenna, decreases as the frequency of the application decreases. In fact, the efficiency decreases by roughly the square of the frequency. In the FM band, the antenna therefore becomes inefficient due to the lower frequency operation with respect to the other wireless application in a mobile cellular device. To overcome this inefficiency, the FM-band transmitter power amplifier has to supply more output power than it would with the use of a dipole antenna of, e.g., 1½ meters long. However, because the loop antenna is high-Q, it attenuates out-of-band signals much better than does a dipole antenna; the only requirement is the antenna has to be tuned properly for each transmit channel.

Though a loop antenna is inefficient for the FM band, it may be suitably efficient for other bands depending on the length of the loop antenna as well as the frequency of the operation. Thus, any undesired power transmitted by FM power amplifier in these bands (e.g., GSM), and may be transmitted by the antenna at much higher efficiency. As a result, the transmitted signal at the output of the transmit power amplifier should have a low leakage at these frequencies, regardless of the efficiency of the antenna.

As stated above, some filtering should occur before amplification in a linear output driver. FIG. 1 is a simplified block diagram of an FM power amplifier. A synthesizer (not shown) provides an unfiltered FM modulated signal 105 that takes the form of a square wave. Frequency modulation can be produced by modulating the output frequency of the synthesizer. The unfiltered FM modulated signal 105 enters a pre-filter 110. A passive high-order pre-filter is not possible due to the low-Q of an on-chip inductor at the of the frequency of the unfiltered FM modulated signal 105. On the other hand, an active pre-filter at 100 MHz will be power consumptive. In one embodiment, therefore, a mixture of active and passive filtering is used. A filtered FM modulated signal 115 produced by the pre-filter 110 is provided to an output driver 120. As stated before, the output driver 120 is highly linear. An output signal is provided through an constant-voltage junction 125 to a loop antenna 130 which, in the illustrated embodiment is a high-Q antenna having a high impedance.

The FM power amplifier of FIG. 1 contains some challenges. The first one is the design of the pre-filter 110. An active filter, such as a Gm-C or an active-RC pre-filter, consumes a significant amount of power at the high frequency operation of FM radio. On the other hand, an on-chip passive LC pre-filter is too resistive for FM frequencies, though it provides suitable filtering for the higher harmonics of the input signal. Furthermore, due to the example filtering requirements set forth above, the order of an on-chip passive LC pre-filter may be required to be more than three, which requires a significant area to implement in passive form as an on-chip LC filter. One embodiment of the pre-filter 110 will now be described that does not suffer from these disadvantages.

Figure 2:
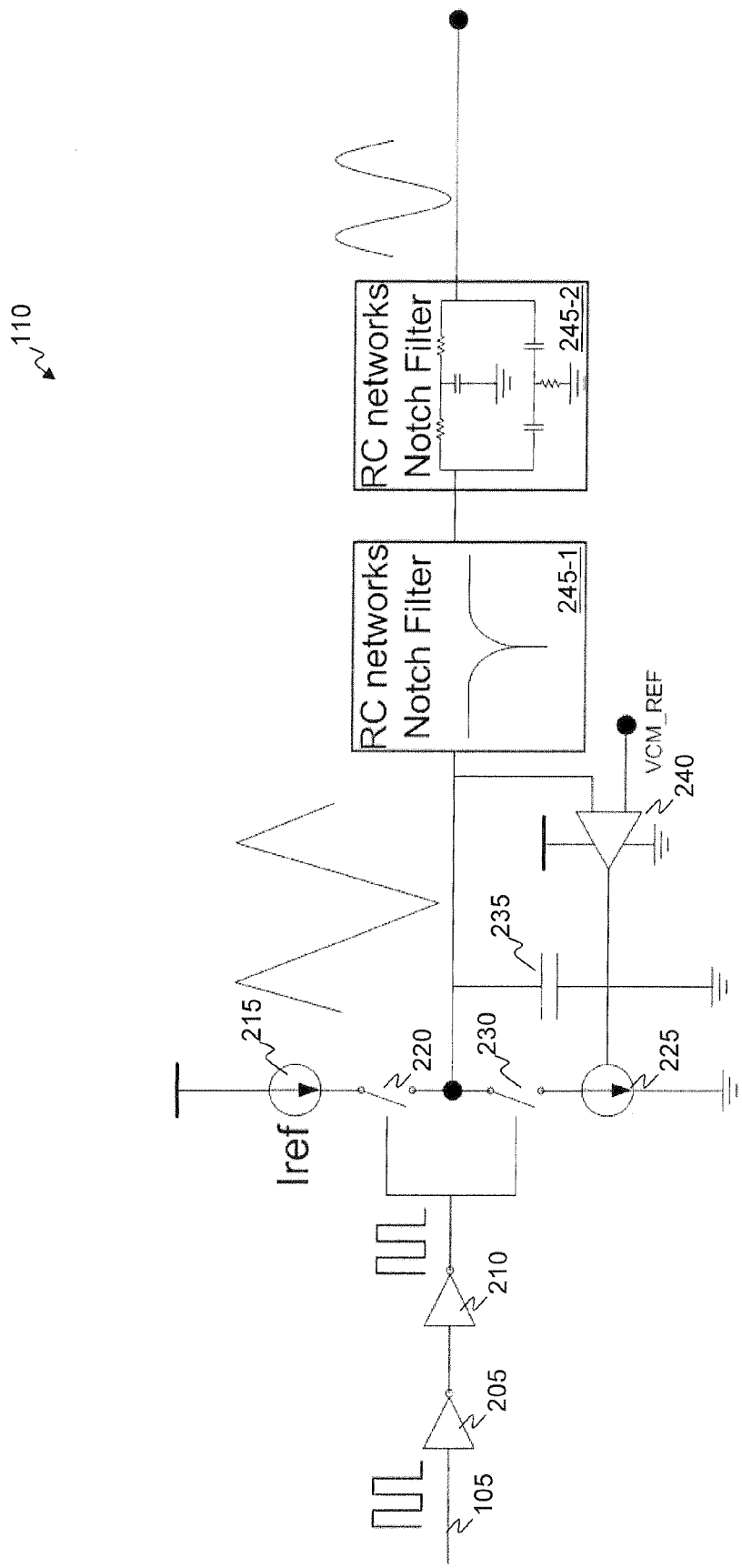
FIG. 2 is a simplified schematic of the pre-filter of FIG. 1.

FIG. 2 is a simplified schematic of this embodiment. The unfiltered FM modulated signal 105 of FIG. 1 enters a charge-pump based integrator having first and second stages 205, 210. Switches 220, 230 toggle based on the phase of the unfiltered FM modulated signal 105, causing a constant current supplied by current sources 215, 225 to integrate on a capacitor 235 as a function of the phase.

The integration of the square wave shape of the unfiltered FM modulated signal 105 yields a triangular waveform as FIG. 2 indicates. The Fourier series coefficients of a triangular signal are as follows:

$$|\hat{a}_k| = \frac{1}{k\omega_0} \cdot |a_k|,$$

where k is the number of harmonics, and $a_k$ are the Fourier coefficients of a square wave. Thus, converting the square wave into a triangular wave yields an extra 19 dB attenuation on the $9^{th}$ harmonic, i.e., in the GSM band. As a result, a 38 dB difference is created between the fundamental and the $9^{th}$ harmonic of the signal after integration. Two RC notch filters 245-1, 245-2 are provided to create more rejection in the target band. In the illustrated embodiment, the RC notch filters 245-1, 245-2 are identical to one another and have a notch frequency centered about approximately 800 MHz. Additional filtering of the $7^{th}$ and $9^{th}$ harmonics occurs in the high-Q antenna 130 of FIG. 1. Even though the even harmonics of an ideal square wave contain no power, nonlinearities in the transmit power amplifier causes some power to be present in the even harmonics as well. Thus, in one embodiment, filtering is also performed with respect to even harmonics. In the illustrated embodiment, setting the notch frequency of the RC notch filters 245-1, 245-2 at about 800 MHz also achieves this purpose.

Since the integration gain is higher for lower frequencies, the integrator employs an adjustable current source and adjustable capacitor array to accommodate the gain difference that occurs over the FM band (i.e., between about 76 MHz and about 108 MHz). The adjustable current source also allows the output power of the transmit power amplifier to be tuned. In one embodiment, the output power may be tuned in 0.2 dB increments. The charge-pump based integrator needs a common-mode feedback due to the high impedance output of the circuitry. An error feedback generated by an operational amplifier 240 to the current source 225 provides a negative feedback signal to adjust the current source 225 as the common-mode output voltage of the integrator varies. In the illustrated embodiment, the RC notch filters 245-1, 245-2 employ adjustable capacitors to allow the notch frequency to be adjusted as process-dependent device characteristics and operating temperature vary.

Figure 3:
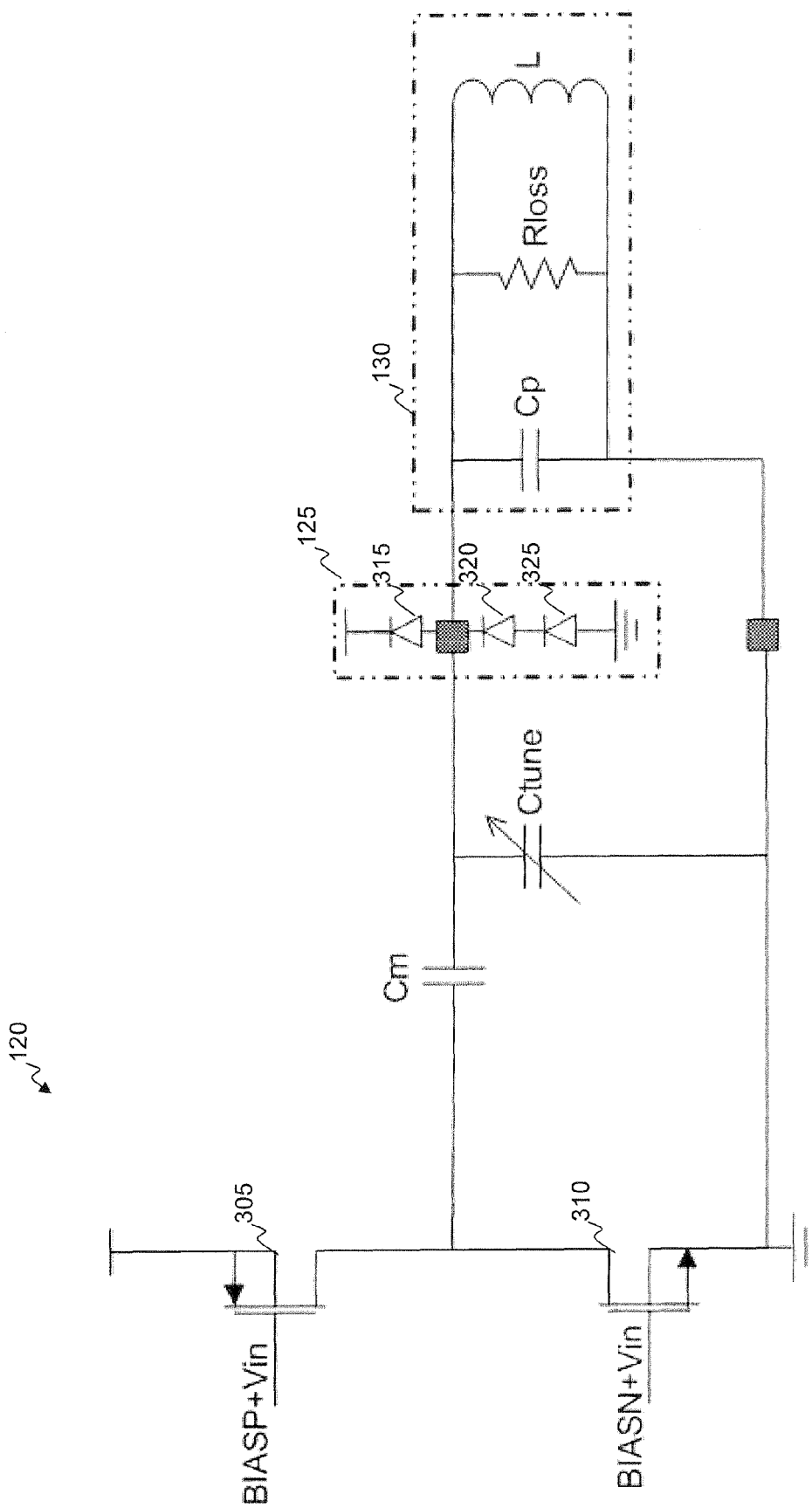
FIG. 3 is a simplified schematic of the output driver of FIG. 1 and an impedance-matching network thereof.

FIG. 3 is a simplified schematic of the output driver 120 of FIG. 1 and an impedance-matching network thereof. The output driver 120 is composed of two transconductor devices: a positive-channel metal-oxide semiconductor (PMOS) device 305 and a negative-channel MOS (NMOS) device 310. The efficiency of this combination of PMOS and NMOS transconductor devices 305, 310 is higher than a typical class-A type output driver, since, as the PMOS and NMOS transconductor devices 305, 310 have the same quiescent current, it provides approximately twice the transconductance. In the illustrated embodiment, the PMOS and NMOS transconductor devices 305, 310 have switchable NMOS and PMOS fingers, such that the transmit power can be increased or decreased as desired.

To increase the deliverable power to the antenna 130, its impedance has been reduced, and an impedance matching network has been used. Two capacitors, Cm and Ctune, constitute the embodiment of the impedance network of FIG. 3. Since the antenna 130 is a high-Q antenna, the impedance network assumes the form of a tunable shunt capacitor array in order to tune the impedance matching network appropriately for the transmit frequency.

FIG. 3 also illustrates one embodiment of the constant-voltage junction 125 in which a diode ladder provides protection against damage from electrostatic discharge (ESD).

Figure 4:
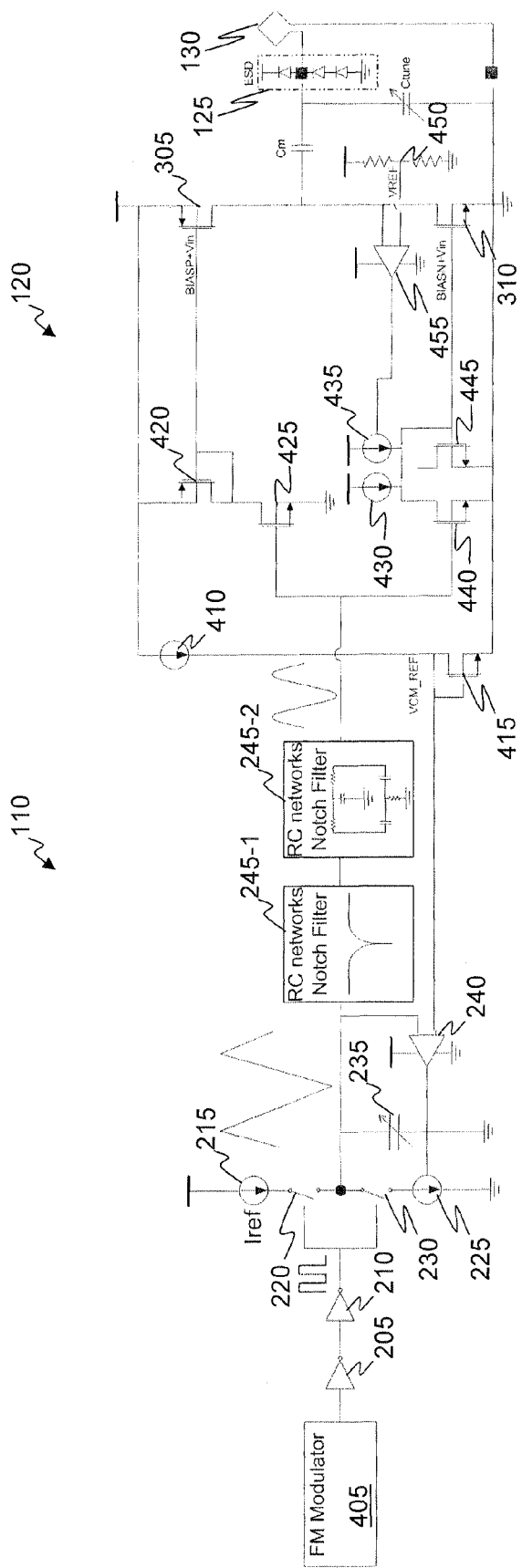
FIG. 4 is a schematic of one embodiment of an FM-band transmit power amplifier that allows transmission in other bands.

FIG. 4 is a schematic of one embodiment of an FM-band transmit power amplifier that allows transmission in other bands. In the illustrated embodiment, the linearity of the output driver 120 is increased by biasing the PMOS and NMOS transconductor devices 305, 310 separately such that their gate overdrive voltage are sufficiently high to reduce the nonlinearity due to transconductance variance. A transistor 420 controls the bias to the PMOS transconductor device 305, and a transistor 445 controls the bias to the NMOS transconductor device 310 using current sources 430, 435.

As FIG. 4 shows, transistors 425, 440 convert the voltage output of the pre-filter 110 into a current output in order to deliver the same desired current to both the PMOS and NMOS transconductor devices 305, 310, which have different bias voltages but the same quiescent current. The current source 410 and the transistor 415 provide a voltage reference to the pre-filter 110.

Furthermore, as it is shown in FIG. 4, a common-mode feedback is desired to control the output voltage of the output driver 120, as it may oscillate due to the high impedance of its node. The voltage source 450 and the operational amplifier 455 provide such feedback to the current source 435. In the illustrated embodiment, the output node DC voltage is controlled by setting the biasing current of the NMOS transconductor device 310 to be at a level that provides the highest voltage swing without introducing a substantial nonlinearity. In the illustrated embodiment, the portion of the biasing current that is controlled by common-mode feedback is chosen such that common-mode feedback is able to adjust the output DC voltage even at the worst case mismatch conditions. An increase in the amount of biasing current that is controlled by common-mode feedback increases the adjustable range of the output DC voltage in case of mismatch, however it also increases the gain of the common feedback loop.

The output of the pre-filter 110 is controlled such that it also produces the biasing for the transistors 425, 440 that convert the voltage output of the pre-filter 110 to a current output. In the illustrated embodiment, the DC biasing voltage of the transistors 425, 440 has been chosen such that it provides the maximum headroom for the charge-pump output and a suitably high gate overdrive voltage for the transistors 425, 440 in normal temperature. In the illustrated embodiment, overall design margins have been set such that temperature variations do not materially degrade the performance of the pre-filter 110.

From the above, it is apparent that:

1. The higher harmonics of a square wave signal can be filtered out by the combination of a charge-pump based integrator along with some passive RC filtering. The charge-pump based integrator provides a power and area efficient filtering as an initial filtering for the square wave. Furthermore, as the biasing current of a charge-pump integrator can be changed, it provides a simple and finely controllable overall transmitted power. This results in reduced IC area and power consumption.

2. The output DC voltage of the charge-pump integrator can be controlled by a common-mode feedback circuit, and the reference voltage for this feedback circuit can be produced with a replica diode-connected device that has matched to the quiescent current of a push-pull type output stage. If the transistors in the push-pull stage are biased appropriately as FIG. 4 shows, it operates as a Class-A output stage with two transconductors that use the same quiescent current, which doubles the current efficiency of the circuit and provides high linearity. Furthermore, the transmit power amplifier of FIG. 4 provides a selective, inexpensive filter processor.

3. As it is shown in FIG. 4, the maximum transferable power can be increased by reducing the impedance driven by the output driver 120 by using a capacitive matching network. This capacitive matching network can be automatically tuned appropriately for each transmit frequency.

Figure 5:
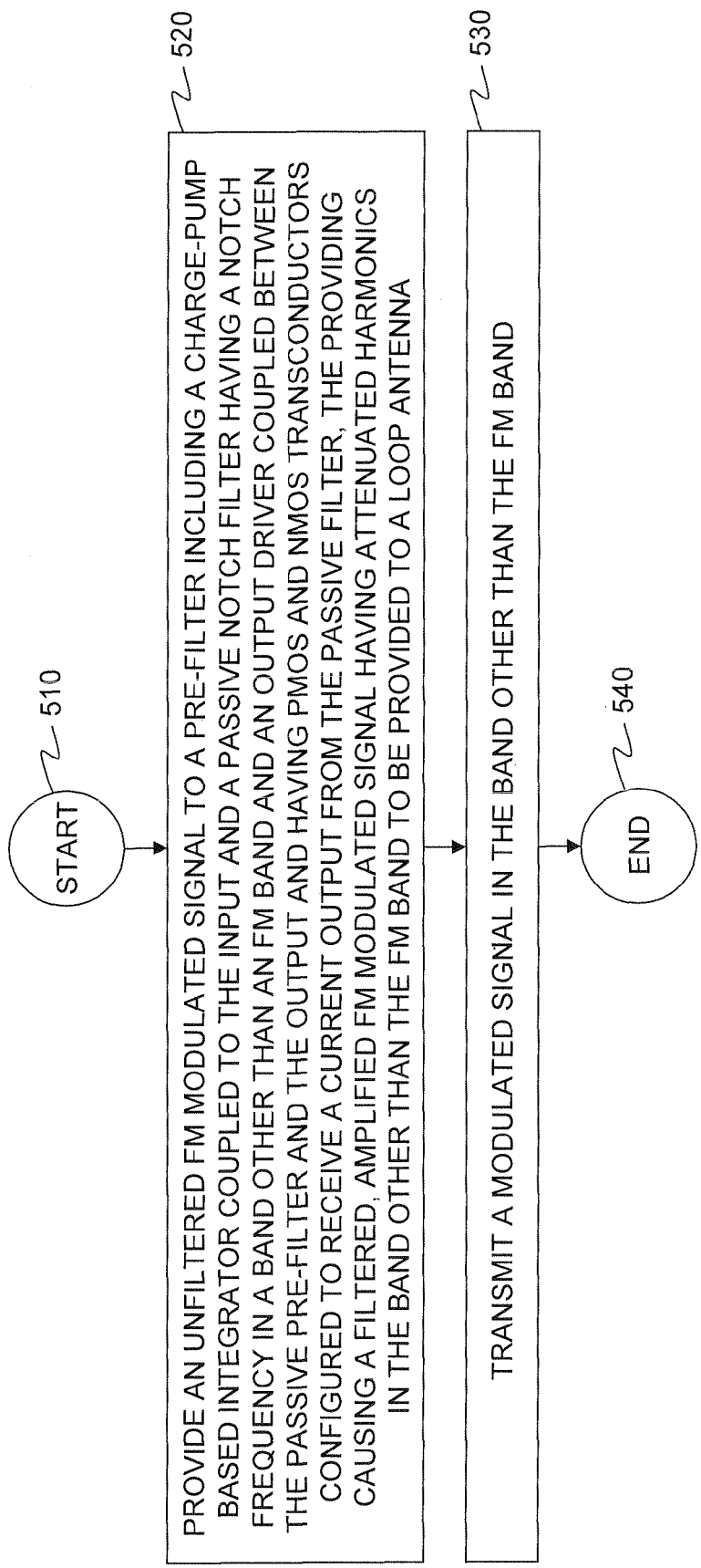
FIG. 5 is a flow diagram of a method of transmitting in multiple bands.

FIG. 5 is a flow diagram of a method of transmitting in multiple bands. The method begins in a start step 510. In a step 520, an unfiltered FM modulated signal is provided to a pre-filter. The pre-filter includes a charge-pump based integrator coupled to the input and a passive notch filter having a notch frequency in a band other than an FM band. The pre-filter further includes an output driver coupled between the passive pre-filter and the output and having PMOS and NMOS transconductors configured to receive a current output from the passive filter. The providing step 520 causes a filtered, amplified FM modulated signal having attenuated harmonics in the band other than the FM band to be provided to a loop antenna. In a step 530, a separate transmitter transmits a modulated signal in the band other than the FM band. The method ends in an end step 540.

Those skilled in the art to which the invention relates will appreciate that other and further additions, deletions, substitutions and modifications may be made to the described embodiments without departing from the scope of the invention.

What is claimed is:

1. An FM-band transmit power amplifier having an input and an output, comprising:
   a pre-filter including:
      a charge-pump based integrator coupled to said input and including a first current source, a first switch, a second switch, and a second current source coupled in series between a first node and a second node, a capacitor coupled to an integrator output node between said first and second switches and said second node,
      a first passive RC notch filter coupled to said integrator output node,
      a second passive RC notch filter coupled to said first passive RC notch filter, said first and second passive RC notch filters having a notch frequency in a band other than an FM band and having tunable capacitors such that said notch frequency is tunable, said band other than said FM band being selectable; and,
      an operational amplifier having a first input coupled to said integrator output node and a second input coupled to a reference voltage and an output coupled to said second current source to provide a negative feedback signal to adjust said second current source as a common-mode output voltage of said integrator varies; and
   an output driver coupled between said second passive RC notch filter and said output and having separately biased PMOS and NMOS transconductors configured to receive an output from said second passive RC notch filter.

2. The amplifier as recited in claim 1 wherein said first and second switches are configured to toggle based on a phase of an unfiltered FM modulated signal received at said input to cause a constant current supplied by said first and second current sources to integrate on said capacitor as a function of said phase.

3. The amplifier as recited in claim 1 wherein said output driver includes an operational amplifier configured to provide a negative feedback signal to adjust a current source therein as a DC output voltage of said output driver varies.

4. An FM-band transmit power amplifier having an input and an output, comprising:
   a pre-filter including:
      a charge-pump based integrator coupled to said power amplifier input and including a first current source, a first switch, a second switch, and a second current source coupled in series between a first node and a second node, a capacitor coupled to an integrator output node between said first and second switches and said second node,
      a first passive RC notch filter coupled to said integrator output node,
      a second passive RC notch filter coupled to said first passive RC notch filter, said first and second passive RC notch filters having a notch frequency in a band other than an FM band and having tunable capacitors such that said notch frequency is tunable, said band other than said FM band being selectable; and,
      an operational amplifier having a first input coupled to said integrator output node and a second input coupled to a first reference voltage and an output coupled to said second current source to provide a negative feedback signal to adjust said second current source as a common-mode output voltage of said integrator varies; and
   an output driver coupled between said second passive RC notch filter and said power amplifier output, said output driver including:
      separately biased PMOS and NMOS transconductors coupled in series between said first and second nodes and configured to receive an output from said second passive RC notch filter, said PMOS transconductor having a gate coupled to the gate of a first bias transistor to control the bias to the PMOS transconductor, said NMOS transconductor having a gate coupled to the gate of a second bias transistor to control the bias to the NMOS transconductor, a third current source coupled in series with said second bias transistor between said first and second nodes; and
      an operational amplifier having a first input coupled to a node between said PMOS and NMOS transconductors, a second input to a second reference voltage, and an output coupled to said third current source to provide a negative feedback signal to adjust said third current source as a DC output voltage at said node between said PMOS and NMOS transconductors varies.

5. The amplifier as recited in claim 4 wherein said output driver includes a third transistor coupled in series with said first bias transistor between said first and second nodes and a fourth transistor coupled in parallel with said second bias transistor, said third and fourth transistors a voltage output of said pre-filter to a current output.

6. The amplifier as recited in claim 4 wherein said first and second switches are configured to toggle based on a phase of an unfiltered FM modulated signal received at said input to cause a constant current supplied by said first and second current sources to integrate on said capacitor as a function of said phase.

* * * * *